United States Patent
Thallner et al.

(10) Patent No.: US 11,681,228 B2
(45) Date of Patent: Jun. 20, 2023

(54) METHOD AND APPARATUS FOR ILLUMINATING IMAGE POINTS

(71) Applicant: EV Group E. Thallner GmbH, St. Florian am Inn (AT)

(72) Inventors: Bernhard Thallner, St. Florian am Inn (AT); Boris Povazay, Vienna (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/973,578

(22) PCT Filed: Jun. 19, 2018

(86) PCT No.: PCT/EP2018/066181
§ 371 (c)(1),
(2) Date: Dec. 9, 2020

(87) PCT Pub. No.: WO2019/242840
PCT Pub. Date: Dec. 26, 2019

(65) Prior Publication Data
US 2021/0247697 A1   Aug. 12, 2021

(51) Int. Cl.
*G03F 7/20* (2006.01)
*G03F 7/00* (2006.01)

(52) U.S. Cl.
CPC .......... *G03F 7/704* (2013.01); *G03F 7/2051* (2013.01); *G03F 7/70283* (2013.01);
(Continued)

(58) Field of Classification Search
CPC ... G03F 7/704; G03F 7/70291; G03F 7/70466
See application file for complete search history.

(56) References Cited

U.S. PATENT DOCUMENTS

| 5,393,987 A | 2/1995 | Abboud et al. |
| 6,903,798 B2 | 6/2005 | Shirota et al. |

(Continued)

FOREIGN PATENT DOCUMENTS

| EP | 1363166 A2 | 11/2003 |
| JP | H07-509589 | 10/1995 |

(Continued)

OTHER PUBLICATIONS

International Search Report from corresponding International Patent Application No. PCT/EP18/66181, dated Feb. 25, 2019.

(Continued)

*Primary Examiner* — Steven Whitesell Gordon
(74) *Attorney, Agent, or Firm* — Kusner & Jaffe

(57) ABSTRACT

A method for the exposure of image points of a photosensitive layer comprising a photosensitive material on a substrate by means of an optical system. The method including continuously moving the image points with respect to the optical system; and controlling a plurality of secondary beams by means of the optical system individually for individual exposures of each image point, whereby the secondary beams are put either into an ON state or into an OFF state, wherein a) secondary beams in the ON state produce an individual exposure of the image point assigned to the respective secondary beam and b) secondary beams in the OFF state do not produce any individual exposure of the image point assigned to the respective secondary beam; wherein, for the generation of image points with grey tones n>1, individual exposures are carried out by different secondary beams with individual doses D.

18 Claims, 4 Drawing Sheets

(52) U.S. Cl.
CPC ...... *G03F 7/70291* (2013.01); *G03F 7/70358* (2013.01); *G03F 7/70466* (2013.01); *G03F 7/70558* (2013.01)

(56) References Cited

U.S. PATENT DOCUMENTS

| | | | |
|---|---|---|---|
| 2003/0214644 A1* | 11/2003 | Shirota | G03F 7/70291 355/67 |
| 2005/0002002 A1 | 1/2005 | Shirota et al. | |
| 2005/0084766 A1* | 4/2005 | Sandstrom | G03F 7/70283 430/5 |
| 2006/0139980 A1* | 6/2006 | Bontekoe | G03F 7/70283 365/15 |

FOREIGN PATENT DOCUMENTS

| | | |
|---|---|---|
| JP | 2000-267256 A | 9/2000 |
| JP | 3323505 B2 | 6/2002 |
| JP | 2003-332221 A | 11/2003 |
| WO | WO 9428574 A1 | 12/1994 |
| WO | WO-2006109709 A1 * 10/2006 ............... G03F 1/68 |

OTHER PUBLICATIONS

Office Action issued in corresponding Japanese Patent Application No. 2020-567555 dated Jun. 7, 2022 along with English-language translation.

Last Reasons for Rejection issued in related Japanese Patent Application No. 2020-5675555 dated Jan. 12, 2022.

\* cited by examiner 8  8'  8"  8'''

METHOD AND APPARATUS FOR ILLUMINATING IMAGE POINTS

FIELD OF THE INVENTION

The present invention relates to a method for the exposure of image points of a layer comprising a photosensitive material on a substrate by means of an optical system and a corresponding device.

BACKGROUND OF THE INVENTION

The semiconductor industry is seeking to find ever better and more efficient methods for micro- and nano-structuring of surfaces. Most surfaces are structured by means of lithography. The lithographic techniques in the semiconductor industry can roughly be split up into two large sub-sectors, into imprint lithography and photolithography. In photolithography, use is made in most cases of masks which are intended to project a structure into a photosensitive material. These masks can either be projected scaled-down with the aid of projection techniques onto the photosensitive material layer or the mask structure is transferred into the photosensitive material without optical scaling. The production of the masks is time-consuming, cost-intensive and bound up with errors.

In recent years, moreover, so-called maskless lithography techniques have been developed. These techniques are based on the principle that at least one image point, but in particular a plurality of image points, are exposed simultaneously and, after the exposure, a relative displacement between the photosensitive material and the optical system, which is responsible for the image point exposure, occurs. In particular, these are scanning processes. An area that is becoming increasingly important in the, in particular maskless, photolithography is the possibility of a controllable exposure of the photosensitive material in the third direction standing normal on the relative movement plane. These methods are referred to as grey-tone lithography and most recently enable a three-dimensional or 2.5 dimensional photolithographic exposure of a photosensitive material and therefore structuring of the material.

Structures in the semiconductor industry have for decades been produced with the aid of photolithographic methods. To be able to produce three-dimensional structures, a plurality of masks for a plurality of exposure processes generally has to be produced. Each exposure step is preceded by a coating process and each exposure step is followed by a development step. Only after the successful exposure can the masks made of the photosensitive material be used for etching or for the metal coating.

In the case of the aforementioned maskless exposure technologies, it is true that there is no need for the mask itself, but a multi-layer process is required to generate a three-dimensional structure.

The maskless exposure technology has been extended by black-white or grey-tone lithography, with the aid of which a photosensitive material was able to be exposed not only two-dimensionally, but three-dimensionally. Experience has however shown that the methods used did not deliver optimum products. In particular, the quality of the exposed profiles and/or the duration for the exposure were unsatisfactory. In the case of black-white lithography, an image point is either exposed or not exposed.

In the case of grey-tone lithography, a micro-mirror device (digital micro-mirror device, hereinafter: DMD) is fixed with respect to the photosensitive material layer, after which the individual mirrors of the DMD are switched for well-defined times in such a way that they deliver a desired dose onto the respective image point. This process is very time-consuming.

The methods mentioned in the prior art require in particular the use of step processes (step-and-repeat). The problem in the prior art thus includes the fact that there are no efficient, cost-effective methods for structuring a photosensitive material three-dimensionally.

SUMMARY OR THE INVENTION

The problem solved by the present invention, therefore, is to provide a device and a method, wherein an at least 2.5 dimensional, preferably three-dimensional, photolithographic exposure of a photosensitive material can be carried out efficiently and with means that are as simple and cost-effective as possible.

This problem is solved with the features of claims 1 and 7. Advantageous developments of the invention are stated in the sub-claims. All combinations of at least two of the features stated in the description, the claims and/or the figures also fall within the scope of the invention. In the case of stated value ranges, values lying within the stated limits should also be deemed to be disclosed as limiting values and can be claimed in any combination.

The idea underlying the invention is to provide a method for the exposure of image points of a photosensitive layer comprising a photosensitive material on a substrate by means of an optical system with the following features:

the image points are continuously moved with respect to the optical system,
  a plurality of secondary beams are controlled by means of the optical system individually for individual exposures of each image point, whereby the secondary beams are put either into an ON state or into an OFF state, wherein
  a) secondary beams in the ON state produce an individual exposure of the image point assigned to the respective secondary beam and
  b) secondary beams in the OFF state do not produce any individual exposure of the image point assigned to the respective secondary beam.
  wherein, for the generation of image points with grey tones n>1, individual exposures are carried out by different secondary beams with individual doses D, wherein the grey tone G of each image point is defined by the sum of the individual doses D.

According to an alternative, more complex embodiment of the aforementioned invention, a plurality of secondary beams are controlled by means of the optical system individually for individual exposures of each image point, wherein the secondary beams are put into an ON state or into an OFF state or into a defined intermediate state lying between the ON state and the OFF state.

Furthermore, the invention relates to a device for the exposure of image points of a photosensitive layer comprising a photosensitive material on a substrate by means of an optical system with the following features:

means for the continuous movement of the image points with respect to the optical system,
  control means for the individual control of a plurality of secondary beams by means of the optical system for individual exposures of each image point, whereby the secondary beams can be put either into an ON state or into an OFF state, wherein a) secondary beams in the ON state produce an individual exposure of the image point assigned to the respective secondary beam and
b) secondary beams in the OFF state do not produce any individual exposure of the image point assigned to the respective secondary beam, individual exposure means for the generation of image points with grey tones by n>1 individual exposures by means of different secondary beams with individual doses D, wherein the grey tone G of each image point can be defined by the sum of the individual doses D.

The invention describes in particular a plurality of methods and a device for the at least 2.5 dimensional, preferably three-dimensional photolithographic exposure of a photosensitive material. The invention is based primarily on a plurality of different methods to generate this photolithographic exposure. The basic idea is based (i) on a multiple exposure of an image point by means of mirrors of a DMD which are arranged, in particular directly, one behind the other and/or (ii) the use of a mathematical algorithm for adjusting an image point pattern and/or (iii) variation/control of the radiation intensity of the light source and/or of the dose per image point.

2.5 dimensional and three-dimensional photolithographic exposure are used synonymously in the following for the further dimension of the greyscale or multiple exposure of individual image points.

In other words, an essential part of the invention comprises a plurality of methods, which are independent of one another but can be applied together, with the aid of which methods a 2.5 dimensional, photolithographic exposure is enabled. The methods differ technically from one another, but can be combined with one another arbitrarily, in order to be able to implement corresponding combination methods with optimised results.

All the methods described according to the invention have in common the fact that a targeted, locally resolved, 2.5 dimensional exposure of a photosensitive material can be carried out with them. The individual, preferably independent, core aspects of the whole invention, which can be regarded or applied in particular in an arbitrary combination, are:
(i) the generation of a greater positioning accuracy of the individual image points, in particular by an inclined position and/or distorted image of the exposure raster grid, and/or
(ii) continuous exposure method in contrast to step process methods (no step-and-repeat), and/or
(iii) superposition of the intensity profiles of adjacent image points, and/or
(iv) binary control of the DMD mirrors, i.e. each mirror can be switched only between two states (ON-OFF) and/or
(v) control of the dose in an image point by combined switching of a plurality of DMD mirrors at different points in time, i.e. in particular by oversampling and/or
(vi) use of mathematical algorithms to generate a pattern and/or
(vii) control of the dose of the primary source/light source.

The core idea of the invention is comprised primarily in the fact that the generation of a grey-tone lithography is enabled by the use of at least one of the inventive processes, in particular with the simultaneous sacrifice/reduction of the positioning accuracy.

The methods according to the invention, as well as the described requirements to permit the methods to be carried out, offer a plurality of advantages over the prior art.

In contrast to the prior art, in which step-and-repeat techniques are mainly used, a scanning method is preferably used in the methods according to the invention, i.e. a continuous relative movement between the DMD and the photosensitive material. The throughput is markedly increased by the use of scanning methods, since the relative movement between the DMD and the photosensitive material is not stopped or at least slowed down after every step, in order to provide the image points to be exposed in the photosensitive material with the given dose by means of an, in particular, individual control of the mirrors of the DMD. The systems and methods according to the invention are therefore suitable particularly for high-volume manufacturing (HVM).

A further important advantage and aspect of the methods according to the invention includes the fact that all the mirrors of the DMD are switched simultaneously/synchronously, i.e. all the mirrors are brought simultaneously either into the one or the other of the just two states. The dose projected onto the photosensitive material can thus be adjusted in a targeted and locally resolved manner. The DMDs do not therefore have to be adjusted individually at a position, i.e. the mirrors of the DMD are always all switched in synchrony.

An essential aspect is the possibility of the targeted adjustment of a grey tone in an image point by the repeated exposure of a plurality of mirrors, which are located along a line parallel to the relative movement direction. The targeted adjustment of a grey tone is enabled by this aspect according to the invention.

A further, additional aspect of the invention includes not only the targeted adjustment of the grey tone by oversampling, but in particular also the superposition of the image points by intensity profiles of finite width.

An, in particular, additional superposition of the image points in the lateral direction (normal to the direction of the relative movement) takes place simultaneously on the basis of the relatively wide intensity profiles. By means of the methods disclosed according to the invention, a grey-tone exposure is possible in a different and/or combined manner.

The methods according to the invention can be used in particular to replace grey-tone masks and or multiple exposures.

According to the invention, the substrate holder is precisely controlled and positioned particularly during the continuous exposure, wherein, in contrast to step process methods, the position of the optical system (DMD) and of the layer to be exposed is checked, preferably continuously. The exposure, movement and, if appropriate, also the measurement of the already exposed regions is in particular carried out, monitored and controlled simultaneously. The control electronics and/or software is set up for this.

Insofar as the use of algorithms to generate an average grey tone over an image point region takes place, the positioning accuracy is at least partially lost.

For the control of the exposure intensity of each image point or of the grey tone, the behaviour of the resist in particular over a wide intensity range is relevant in terms of control according to the invention, in order to obtain further optimised results.

In order to obtain, according to the invention, a higher grey-tone number in an image point, correspondingly more mirrors are arranged in a mirror exposure column. By controlling a large number of mirrors, the maximum switchover rate of the DMD falls and the data volume to be transmitted becomes greater, wherein the maximum scanning speed diminishes.

The grey-tone number is thus limited by the number of mirror exposure lines which sweep over an image point. One can imagine grouping the mirror exposure lines to form blocks. The quantity of all the mirror exposure lines that can be used for the adjustment of a grey tone is known as a mirror exposure line block. The following example is given by way of example. By means of a DMD with 900 mirror exposure lines, an image with one of 900 grey tones or 900 different grey tones can be generated. If the 900 mirror exposure lines are grouped into three blocks each with 300 mirror exposure lines, an image point can assume only one of 300 grey tones, but in return three image points can be described simultaneously.

The methods according to the invention serve to generate exposed 2.5 dimensional structures in a photosensitive material. The photosensitive material is deposited on the substrate by methods known in the prior art.

The invention discloses a plurality of methods for exposing image points in the photosensitive material in a laterally and vertically targeted manner. Lateral exposure is understood to mean the exposure of an image point in the plane parallel to the surface of the photosensitive material. Vertical exposure is understood to mean an exposure of the photosensitive material at an image point in a defined depth. It is thus possible by means of the inventive methods described to expose three-dimensional structures in a photosensitive material. In the remainder of the text, the terms 3D or three-dimensional are always used, since they are more common.

The structures thus exposed can be developed in further process steps and thus produce a three-dimensional, topographical photosensitive material structure, which is used for further coating and/or etching processes. The further process steps will not be dealt with further here.

The methods according to the invention are described with the aid of the use of a DMD. The use of LCDs (liquid crystal displays), LCoS (liquid crystal on silicon), GLVs (grating light valve) or similar optical elements, which can be used in an analogous manner to the described DMDs, would also be feasible.

All the aforementioned methods according to the invention can also be used to improve the quality in conventional, binary, maskless exposure lithography. In particular, edge effects can be reduced by the mentioned methods. Such optimisation properties will not however be dealt with in detail.

Definitions of Terms

In the following section, some important terms are defined so as to be able to describe the methods according to the invention more efficiently.

An image point is understood in the remainder of the text to mean a defined location in the photosensitive material to be exposed, which location is generated by an individual mirror of the DMD. The image point is therefore a spatially limited region on the photosensitive material to be exposed. The photosensitive material can be exposed up to a defined depth in each image point. Each image point therefore has not only a lateral, but also a vertical extension. The image point is therefore three-dimensional. The vertical extension, i.e. the depth of the image point, is connected in particular with the received dose of electromagnetic radiation. The adjustment of this dose for each image point is an essential aspect of the present invention. In particular, the depth in which the photosensitive material is exposed is fixed by the dose. One of the most important methods according to the invention for defining the dose of an image point includes repeated exposure by a plurality of DMD mirrors. These DMD mirrors are arranged in particular in a line parallel to the relative movement direction of the DMD mirrors one after the other, capable of being aligned on the same image point in each case. The DMD mirrors can be controlled in such a way that each one either projects or does not project (ON-OFF) the same defined dose onto the image point per unit of time.

A grey tone results from the quantity of the photosensitive material of the image point that has received a defined dose and accordingly has been changed chemically. The higher the received dose, the more photosensitive material has been changed chemically and/or physically in terms of depth.

An image point line means a number of image points which are distributed on the photosensitive material, in particular equidistantly along a straight line normal to the relative movement direction.

An image point column means a number of image points which are distributed on the photosensitive material, in particular equidistantly along a straight line parallel to the relative movement direction.

In the remainder of the text, an image point region will be understood to mean a number of, in particular adjacent, image points. The image points of the image point region are exposed in particular by means of a mathematical algorithm, in such a way that the resultant image point region has an average grey-tone value. This average grey-tone value results in particular from the algorithm used, with which the individual grey-tone values of the image points are controlled. When use is made of mathematical algorithms to establish a grey tone, the image point region (and not the image point) represents the actual pixel. The greatest possible resolution is defined by the lateral extension of the image point regions. In particular, it is an aspect of the invention that the lateral order of magnitude of the image point region and the dimensions of a DMD mirror, more precisely the projection of the DMD mirror, are approximately equal. The area of the image point region is in particular greater than 0.5 times, preferably greater than 0.75 times, still more preferably precisely 1.0 times, most preferably greater than 1.5 times, with utmost preference greater than 2.0 times the area of the projected DMD region.

An exposure strip describes a number of image points along a direction, in particular in the direction of the longest movement path of the DMD. For example, in the case of a meandering raster path, the DMD is always moved along a longest possible movement section, which in particular extends up to the edge of a substrate, and travels via a short lateral movement from one movement section to the next movement section.

A primary beam is understood to mean the light beam generated by a radiation source/primary source/light source before it strikes the DMD. The primary beam has its origin in the light source and in particular passes through a plurality of optical elements before it strikes the DMD.

A secondary beam is understood to mean the, in particular each, part of the primary beam reflected by a, preferably individual, mirror of the DVD. A primary beam is thus split up by the DMD into a plurality of secondary beams. The secondary beam thus has its origin in a mirror of the DMD and can pass through a plurality of optical elements before it strikes the photosensitive material.

In the remainder of the text, an intensity profile is understood to mean the cross-sectional intensity distribution of a secondary beam which, particularly with its predominant intensity share of the intensity profile, exposes an image point. The intensity profiles of a plurality of secondary beams lying beside one another preferably intersect, wherein the inflection point of an intensity profile lies in each case inside an intensity profile of an adjacent secondary beam.

A particularly high homogeneity of the exposure of the image points is thus achieved, in particular also at the edge of the image points.

The dose of an image point is understood to mean the quantity of electromagnetic radiation with which the photosensitive material has been acted upon in an image point at an arbitrary point in time of the maskless writing process (exposure).

The optical power of the primary beam amounts to between 0.01 W and 1000 W, preferably between 0.1 W and 750 W, still more preferably between 1 W and 500 W, most preferably between 10 W and 250 W, with utmost preference between 20 W and 50 W. The optical power that is attributable to a secondary beam then amounts to approximately the ratio between the optical power of the primary beam and the number of irradiated DMD mirrors. A DMD has for example 1000×1000 pixels. Accordingly, in the case of an optical power of the primary beam of 25 W, an optical power of 0.000025 Watt is attributable to the secondary beam. With an assumed irradiation time of 20 µs per image point, the energy of $5*10^{-10}$ J or 500 pJ would be transmitted per individual secondary beam onto an image point. By means of oversampling, this energy per image point during the passage of the DMD can be correspondingly increased.

The image point energy lies in particular between $10^{-12}$ J and 1 J, preferably between $10^{-12}$ J and $10^{-12}$ J, more preferably between $10^{-12}$ J and $10^{-4}$ J, most preferably between $10^{-12}$ J and $10^{-6}$ J, with utmost preference between $10^{-12}$ J and $10^{-9}$ J.

The irradiation time lies in particular between $10^{-9}$ s and 1 s, preferably between $10^{-9}$ s and $10^{-2}$ s, more preferably between $10^{-9}$ s and $10^{-4}$ s, most preferably between $10^{-9}$ s and $10^{-4}$ s, with utmost preference between $10^{-9}$ s and $10^{-6}$ s.

The individual dose D is therefore in particular the energy with which an image point is acted upon with an individual exposure.

The total dose of an image point is understood to mean the cumulative electromagnetic radiation which the photosensitive material has received in an image point at the end of a completely concluded maskless writing process. By means of the aforementioned, preferred overlapping of the intensity of profiles, each image point receives a part of the dose also from secondary beams of adjacent image points. The cumulative dose establishes in particular the grey tone of an image point.

A mirror line is understood to mean a number of mirrors of a DMD which are positioned along a first axis of the DMD reference system. If the DMD is not rotated with respect to the movement direction, this axis stands normal to the movement direction.

A mirror column is understood to mean a number of mirrors of a DMD, which are positioned along a second axis of the DMD reference system. This second axis stands normal to the first axis of the DMD reference system.

By means of a rotation of the DMD relative to the movement direction, as preferred according to the invention, the mirror lines are not arranged normal or the mirror columns are not arranged parallel to the movement direction.

A mirror exposure line is understood to mean a number of mirrors of a DMD which lie along a line normal to the movement direction. If the DMD is not rotated in respect of the movement direction, the exposure line and the mirror line would be identical relative to the lateral arrangement A mirror exposure column is understood to mean a number of mirrors of a DMD which lie along a line parallel to the movement direction. If the DMD is not rotated with respect to the movement direction, the exposure column and the mirror column would be identical relative to the lateral arrangement.

A mirror exposure line block is understood to mean a number of mirror exposure lines which are required for the complete exposure of all the image points.

If a DMD is equipped with more lines than are required for a mirror exposure block, the additional DMD mirrors can perform additional functions. They can in particular be used as a redundancy, or additional mirror exposure line blocks can be formed. The number of mirror exposure lines per mirror exposure line block is advantageously constant, i.e. the number of mirror exposure line blocks is a whole-number divisor of the number of mirror exposure lines. The grey-tone number is then limited by the number of the mirror exposure lines per mirror exposure line block.

In the remainder of the text, different parameter sets are disclosed, which also relate to the static features accuracy and precision.

Accuracy is understood to mean a systematic error. A systematic error is the deviation of the expected value of a parameter from the true value of the population which is determined statically from the random sample quantity. The greater the accuracy, the smaller the value of the deviation, i.e. the smaller the systematic error.

Precision is understood to mean the scatter of a measured variable around the expected value of the random sample quantity. The greater the precision, the smaller the scatter.

Positioning accuracy is understood to mean the accuracy with which an image point in the photosensitive material can be driven in a congruent manner through the centre of a DMD mirror. This positioning accuracy is increased in particular by an inclined position of the DMD relative to the movement direction between the DMD and the photosensitive material.

Device

The device according to the invention comprises a substrate holder and an optical system. The substrate holder has technical features known in the prior art for the fixing and/or alignment and/or movement of a substrate.

The fixings serve to fix the substrates to be processed in the device. The fixings can be
- mechanical fixings, in particular clamps and/or
- vacuum fixings, in particular with individually controllable vacuum tracks or vacuum tracks connected to one another and/or
- electrical fixings, in particular electrostatic fixings, and/or magnetic fixings, and/or
- adhesive fixings, in particular Gel-Pak fixings and/or fixings with adhesive, in particular controllable, surfaces.

The fixings are in particular electronically controllable. The vacuum fixing is the preferred type of fixing. The vacuum fixing preferably comprises a plurality of vacuum tracks, which emerge at the surface of the substrate holder. The vacuum tracks are preferably individually controllable.

In an application which can be carried out in a technically preferred manner, several vacuum tracks are united to form vacuum track segments, which are individually controllable and thus can be evacuated or flooded. Each vacuum segment is preferably independent of the other vacuum segments, i.e. preferably comprising individually controllable vacuum segments. The vacuum segments are preferably designed in an annular form. This thus enables a targeted, radially symmetrical fixing and/or release of a substrate from the substrate holder which is carried out in particular from the inside outwards.

The substrate holder can preferably be moved actively relative to a spatially fixed coordinate system. In particular, the position of the substrate holder is continuously tracked, measured and stored during the movement.

The precision of the positioning is described by the confidence interval of the variance. For a three-sigma confidence level of 99.7%, the precision has a confidence interval between 1 nm and 100 µm, preferably between 1 nm and 10 µm, preferably between 1 nm and 1 µm, more preferably between 1 nm and 100 nm, most preferably between 1 nm and 10 nm, with utmost preference between 1 nm and 5 nm.

The optical system of the device comprises in particular at least one light source and in particular one DMD. Optical elements for the homogenisation of the primary beam are preferably located in the optical path, in particular at least or exclusively in the path of the primary beam. All the optical elements are preferably mounted fixed relative to a base, so that a relative movement at least during the exposure takes place exclusively by moving the substrate by means of the substrate holder. All the optical elements can preferably be calibrated in six spatial directions. The foundation or the base, on which the substrate holder is moved, is preferably vibration-damped. The vibration-damping can take place actively and/or passively. The foundation is preferably a granite block. Still more preferably it is an actively vibration-damped granite block.

Method

The DMD mirrors are constituted as binary switching elements in the method described below, which corresponds to a preferred embodiment of the invention, with which the invention can be described more simply. Each mirror of the DMD can at a specific point in time be in a single state of the following two states: Either it reflects its part of the primary beam onto the photosensitive material or it reflects its part of the primary beam in such a way that the latter does not strike the photosensitive material. The two states of a mirror are correspondingly referred to as "on" (ON, the photosensitive material is struck) or "off" (OFF, the photosensitive material is not struck). Accordingly, it is more accurate to speak of the two binary states. This designation simplifies the reading of the text. According to the invention, the use of mirrors which can carry out continuous tilting is conceivable. In technical terms, these mirrors then represent a generic term for the binary switchable mirrors, but are much more complex and expensive both in terms of production and also control technology.

The mirrors of a DMD can preferably only be switched all simultaneously, wherein the selection between ON and OFF exists. The switching frequency for the simultaneous switching of all the mirrors is in particular greater than 1 Hz, preferably greater than 100 Hz, still more preferably greater than 1 kHz, most preferably greater than 100 kHz, with utmost preference greater than 1 MHz.

According to an advantageous, important aspect for all the methods described according to the invention, an increase in the positioning accuracy is achieved in particular by an inclined position of the DMD in relation to the relative movement direction.

As an alternative or in addition to this, an increase in the positioning accuracy can be achieved by the use of optical elements which distort the secondary beams. There are in the prior art still other methods for increasing the positioning accuracy, but these will not all be listed individually here. By way of example, but not limiting, the advantages of increasing the positioning accuracy are described with the aid of the inclined position of the DVD.

According to the invention, a DMD with a single mirror line would be sufficient for a simple maskless (or more correctly dynamically structured) exposure system with a scanning imaging principle. DMDs, which are common and available on the market, usually comprise very many mirror lines (e.g. 1080 mirror lines with in each case 1920 mirror columns in a full HD-DMD). Such DMDs with more than one mirror line are preferably used according to the invention. The additional mirror lines are used in particular to increase the positional accuracy on the one hand by means of oversampling. Oversampling is described for example in U.S. Pat. No. 4,700,235A relating to printing technology.

If, however, a special angle of rotation is selected, a higher number of image points can be exposed per length normal to the movement direction. Angle of rotation a is in particular calculated and defined with the formula $$\alpha = \arctan n/m,$$

wherein n is the spacing of the image point lines and m is the spacing of the image point columns between the two next mirror centres.

In a first method according to the invention, the desired dose of each image point is established cumulatively over a plurality of image points. In particular, each individual exposure takes place with the same individual dose D.

The cumulative exposure of one of the image points takes place by different DMD mirrors, which are located in the same mirror exposure column. The thinking underlying the first idea according to the invention, therefore, is that an image point which has to have a grey-tone level n is exposed, during a relative movement between the DMD and the photosensitive layer, at least n times from n different mirrors of the DMD, which are located along the mirror exposure column. If a maximum grey-scale depth of 128 is selected for example, and an image point is to receive a grey tone n=13, then all the mirrors, from 13 mirrors inside a mirror exposure column, must deliver precisely $1/128$ of the maximum available maximum intensity as a dose. In total, therefore, all the mirrors deliver a dose of $13/128$ of the intensity that would be necessary for a 100% exposure of the image point up to the substrate surface.

The grey tone of an individual image point can be adjusted in a targeted manner by this method according to the invention. Generally, the number of grey tones that can be generated per image point in the first method according to the invention equals the number of the mirror exposure line blocks. Since the DMD generally comprises a plurality of mirrors and correspondingly also a plurality of image points can be exposed simultaneously with in each case the same dose, whole patterns can be generated simultaneously with this method. The aspect of this method according to the invention, therefore, can thus also be summed up to the effect that a time-related averaging of identical exposure steps is carried out with different patterns in each exposure step.

In a second method according to the invention, which can be combined with the first, the desired dose of an image point is generated by the fact that, at each exposure point in time, a precisely adjustable dose acts on the desired image point. To be able to obtain a precisely adjustable dose, there are a number of basic options.

In a first embodiment according to the invention, the intensity of the radiation source of the primary beam is changed in a targeted manner, while the DMD is located over a position to be exposed. The grey tone for an image point is then defined by the doses that arrive in the image point at the given point in time. Since the intensity of the radiation source can be adjusted and changed in a targeted manner, the dose can also be changed in a targeted manner. The method according to the invention is suitable for adjusting the radiation intensity of the source at any point in time to a defined value and, as a result of the dose thus arising per DMD mirror, for exposing a plurality of image points simultaneously with this dose according to the switching state of each mirror.

In particular, the frequency of the radiation of the radiation source can be changed, or a plurality of radiation sources are used, each one of which can generate radiation with another frequency. The frequency of the radiation of a radiation source should harmonise in particular with the used photosensitive material, i.e. should be able to change the latter in a chemical and/or physical manner that is as efficient as possible. By the use of radiation with different intensity, the grey levels in particular can also be varied.

In a first embodiment of the second method according to the invention, the maximum number of the grey tones that can be generated per image point equals $2^k$, wherein k represents the number of the used mirror exposure lines per mirror exposure line block. Accordingly, an image point is exposed or not exposed from k mirror exposure lines of one and only one mirror exposure line block.

In a second embodiment of the second method according to the invention, the maximum number of the grey tones that can be generated per image point equals $2^k$, wherein k represents the number of the used mirror exposure line blocks. Accordingly, an image point is exposed or not exposed from one and only one mirror exposure line of each k mirror exposure line block.

In particular, it is possible with the method according to the invention to adapt the dose for the given mirror exposure line, preferably to change the dose according to a mathematical law with a changing mirror exposure line. The first mirror exposure line can preferably receive the full dose, the second mirror exposure line half the dose, the next mirror exposure line quarter of the dose, the k-th mirror exposure line the $(½)k$ dose.

The frequency with which the intensity of the radiation source can be changed is in particular greater than 10 Hz, preferably greater than 100 Hz, still more preferably greater than 1 kHz, most preferably greater than 100 kHz, with the utmost preference greater than 1 MHz.

In a third method, most preferred according to the invention and able to be combined with the previously described method, a dithering algorithm (dithering) is used, in order to generate an, in particular averaged, dose in an image point region which is in particular larger than an individual image point. The principle of the algorithm comprises the fact that the grey tones of image points lying beside one another are adjusted in such a way that an average grey-tone value for the image point region results.

The aforementioned method can in particular make use of a plurality of algorithms already known in the prior art, with the aid of which the generation of a grey-tone gradient is controlled. In particular, the algorithms ordered and/or
Floyd-Steinberg and/or
Jarvis and/or can be applied. Apart from these preferred algorithms, there are countless other algorithms, which cannot be listed comprehensively here.

The aspect of this method according to the invention can also be summed up to the effect that a relative local subsampling of the original oversampled image points is carried out for the purpose of the option of varying the dose.

The method according to the invention generates an image point region which is larger than the individual image points. Accordingly, the advantage of the positioning accuracy achieved in the case of an inclined position of the DMD is at least partially lost for the grey-tone resolution obtained by the mathematical algorithm.

A further important feature of the methods according to the invention includes a continuous (i.e. not interrupted at least along an exposure strip) relative movement between the photosensitive material and the DMD during the application of the methods according to the invention. The methods according to the invention therefore preferably do not represent step process methods, but rather continuous movement methods.

According to the invention, it is advantageous with all the methods according to the invention if the reflected beams generated by the mirrors have cross-sectional profiles which are at least partially overlapped.

All the methods according to the invention can also be used in conventional, binary lithography, in order to improve the homogeneity of the exposure and therefore to improve the processability and image quality. For this purpose, the intensity distribution of the entire DMD image is first recorded (e.g. with CCD chip in the exposure plane or test exposures with the aid of a grey-tone resist, or a plurality of exposures with level-selective resists) and the write data (raster grid data) are then corrected in such a way that the exposure intensity of the individual image points is more homogeneous.

Furthermore, it is possible to use all the methods according to the invention to improve the image quality for critical structures, whereby in particular the doses for the individual image points are increased or reduced if the latter are not sufficiently resolved in the lithography process (see OPC, optical proximity correction). In this method, in particular, the knowledge of the chemical and physical behaviour of the resist are used, and knowledge of the optical behaviour, in particular in the near field, is advantageous. This knowledge can be determined both theoretically, as well as empirically (e.g. by test exposures) in the form of data series.

Applications/Uses

The methods according to the invention can be used in particular to produce the following products.

In a first application according to the invention, the methods according to the invention can be used to produce a number of optical elements, in particular lenses, in the photosensitive material. Fresnel, convex or concave lenses have marked three-dimensional shapes, which can be generated with the aid of the methods according to the invention. In a particularly advantageous embodiment according to the invention, these optical elements are produced as part of a monolithic lens substrate (monolithic lens substrate, MLS).

According to a second application according to the invention, the methods according to the invention can be used to produce a stamp. The produced stamps are used in particular directly as working stamps and/or master stamps in imprint lithography. These stamps have marked 2.5 dimensional structures.

According to a third application according to the invention, the methods according to the invention can be used to produce lithographic masks or at least to serve as a negative for lithographic masks.

In a fourth application according to the invention, the methods according to the invention can be used to structure a, in particular wavy and non-plane and/or homogeneous, layer of the photosensitive material with the aid of the methods according to the invention. Here, the grey tones are generated relative to the waviness in such a way that the waviness of the photosensitive material does not have any influence on the topography arising after the development. It is thus possible to expose a photosensitive material without having to previously remove the waviness by complicated processes and methods or to carry out the compensation only to a certain degree. According to the invention, time and cost saving in particular thus arises.

In a fifth embodiment according to the invention, the methods according to the invention can be used to generate a flat surface. Generally, every substrate is provided with a certain waviness and/or roughness. A layer which is deposited on such a substrate partially assumes the waviness and/or the roughness of the substrate lying beneath. There are many techniques in the prior art for planarising this wavy layer. By means of the methods according to the invention, once the waviness of the layer has been measured, an inventive lithography could be carried out in such a way that the crests of the waves of the layer are treated lithographically in such a way that, following the exposure and development process, removal of the crests of the waves or planarisation of the layer takes place. A favourable method according to the invention is thus available for the planarisation of the layer, which is not based on mechanical, but rather on purely photolithographic methods.

In a sixth application according to the invention, the methods according to the invention can be used to generate MEMS structures.

All technically possible combinations and/or permutations as well as duplications of the functional and/or material parts of the device and the changes associated therewith are deemed to be disclosed in at least one of the method steps or methods.

Inasmuch as process features are disclosed in the above text or in the subsequent description of the figures, the latter are also deemed to be disclosed as features of the method and vice versa.

Further advantages, features and details of the invention will emerge from the following description of preferred examples of embodiment and with the aid of the drawings.

BRIEF DESCRIPTION OF THE DRAWINGS

In the figures, identical components or components with the same function are denoted with the same reference numbers.

DETAILED DESCRIPTION OF THE INVENTION

Figure 1:
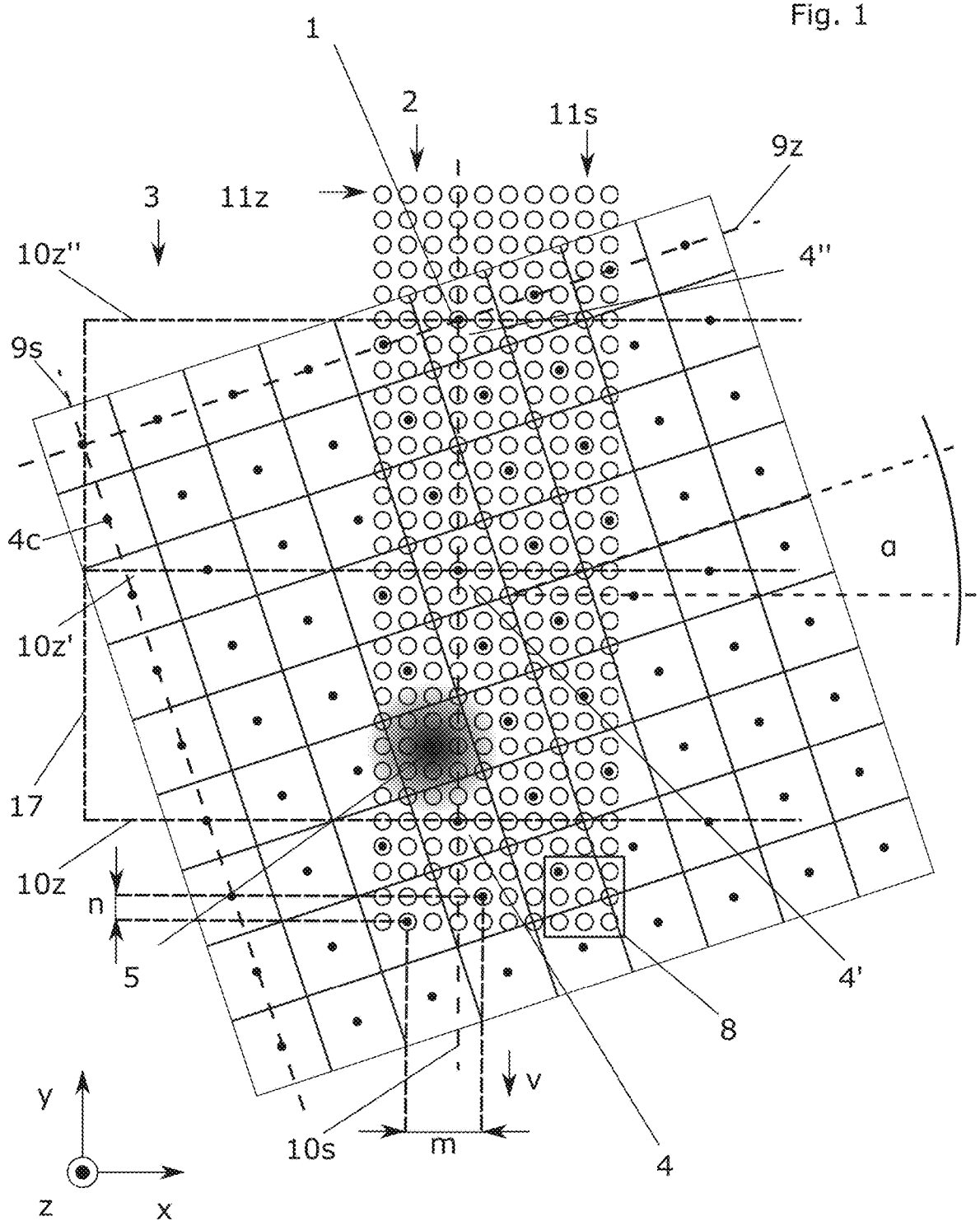
FIG. 1 shows a diagrammatic representation of an embodiment of a device according to the invention with an optical system and a photosensitive layer arranged on a substrate and to be exposed.

FIG. 1 shows a simplified diagrammatic representation of a number of image points 1. Image points 1 are generated (see in this regard in particular FIG. 5) or exposed using the method described below at a surface of a photosensitive material 18 of a photosensitive layer 19, which is deposited on a substrate 6. At least some of image points 1 are exposed.

The micro-mirror device (DMD 3) rotated with respect to relative movement direction v of image points 1 is located above image points 1, the number whereof defines an exposure strip 2. To simplify the representation, not DMD 3 itself, but rather its projection onto photosensitive layer 19 is represented in FIG. 1. For the sake of simplification, a distinction is no longer made between the actual DMD 3 and its actual elements and their projections. Mirrors 4, 4', 4" of DMD 3 are arranged in mirror lines 9z and mirror columns 9s.

Mirror lines 9z are arranged rotated through angle α with respect to movement direction v. Relative movement direction v follows along the y-axis. Substrate 6, on which photosensitive material 18 is located, is fixed on a substrate holder 14 and moves with the latter in the negative y direction, wherein DMD 3 is preferably statically fixed at least during the exposure.

DMD 3 can be constituted mobile for some applications according to the invention, wherein this is a less preferred embodiment. Accordingly, the relative movement between DMD 3 and photosensitive material 18 or image points 1 is denoted by v.

Image points 1 represent the positions which can be exposed by secondary beams 16 deflected from mirrors 4, 4', 4". The width of secondary beams 16 is preferably at least as large as mirrors 4, 4'. 4'. Secondary beams 16 have a characteristic, in particular Gaussian, intensity profile 5, 5'. Characteristic intensity profile 5, 5' defines the intensity distribution in photosensitive material 18 or in respective image point 1.

It can be seen that DMD 3 has been rotated with respect to relative movement direction v, in such a way that each mirror centre 4c of a mirror 4 of DMD 3 is congruent with one of image points 1, which—as described below—are exposed in a targeted manner with regard to their exposure profile.

The relative movement is to be understood to mean that DMD 3 and photosensitive layer 19 to be exposed are moved relative to one another, wherein either DMD 3 or photosensitive layer 19 are preferably moved, while the part not moved is fixed statically. From the technical standpoint, photosensitive layer 19, which is located on substrate 6, is preferably moved actively in respect of a spatially fixed coordinate system, while DMD 3 and all the other optical elements (not shown) are static relative to the spatially fixed coordinate system.

It is shown by way of example that image point 1, in the course of the in particular continuous relative movement, is first located under mirror 4, then under mirror 4' and finally under mirror 4". At each of these points in time, one of mirrors 4, 4', 4" could be switched in such a way that it reflects a secondary beam onto photosensitive material 18, so that photosensitive material 18 is acted upon with a (further) dose to generate a grey tone G. Each such action leads to an increase in grey tone G.

Mirror exposure lines 10z, 10z', 10z" are in each case assigned to a corresponding image point line and stand normal to movement direction v. A mirror exposure column 10s represents a column of image points 1 running in movement direction v (for example image point column 11s), which can be exposed with mirrors 4 arranged in mirror exposure column 10s.

It can be seen in FIG. 1 that a total of four mirrors 4, 4', 4" are located on shown mirror exposure column 10s, mirror centres 4c whereof are congruent with mirror exposure column 10s. In this specific case, therefore, only the three mirrors 4, 4', 4" can be used to expose image point 1, while a relative movement takes place between DMD 3 and photosensitive material 18.

The three mirror exposure lines 10z, 10z', 10z" are assigned to a mirror exposure line block 17. If, for example, DMD 3 comprises six hundred mirror exposure lines 10z, the six hundred mirror exposure lines 10z can for example, and advantageously, be grouped together to form two hundred mirror exposure line blocks 17.

In the example shown here, each of mirror exposure line blocks 17 can thus be used to expose an image point 1 with one of four grey tones G (no exposure at all, exposure with one dose, with two doses or with three doses).

The frame in the right-hand lower part of exposure strip 2 symbolises an image point region 8, comprising a total of nine image points 1. Image point region 8 preferably has roughly the same size as mirror 4 of DMD 3. An average grey tone can be adjusted in this image region 8 by using a dithering algorithm.

A further, essential aspect according to the invention consists includes the fact that, by means of an inclined position of the optical system, in particular of DMD 3, with respect to movement direction v and/or image point lines 11z, an increase in the positioning accuracy takes place, but again this is at least partially delivered in favour of generating an average grey tone in image region 8.

The resolution of the structures in photosensitive material 18 cannot be greater than the resolution of the mirrors in DMD 3. By the fact that, on the one hand, in particular by the inclined position, an increase in the positioning accuracy takes place and, on the other hand, grey tones G are grouped together as average grey tones of an image point region, a very efficient grey-tone lithography can be carried out.

Figure 2:
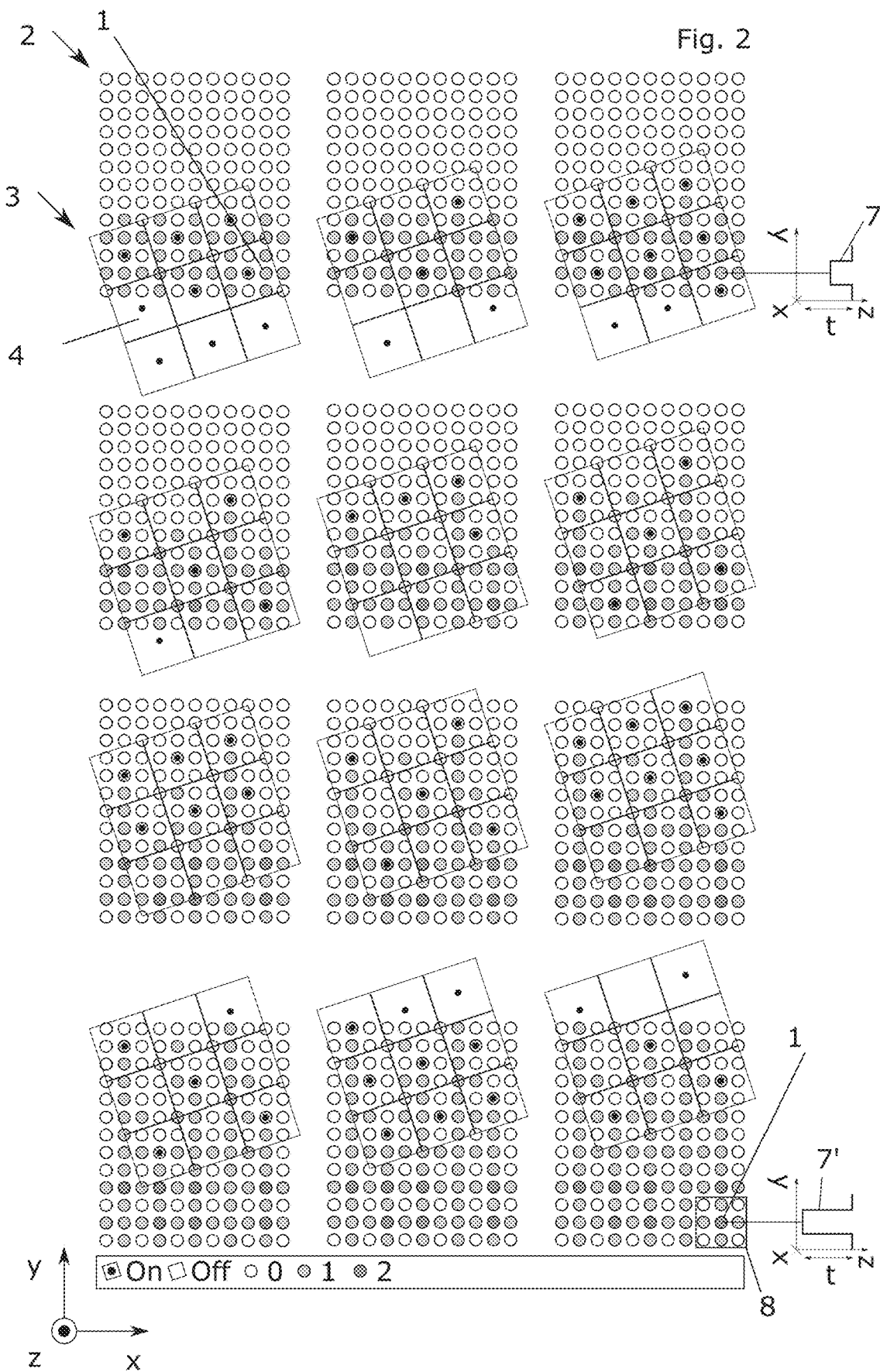
FIG. 2 shows a diagrammatic representation of an embodiment of a method according to the invention with a plurality of method steps following one another.

FIG. 2 shows a series of exposure steps of a part of an exposure strip 2 with a plurality of image points 1. The represented image series in particular represents the combination of the first and second methods according to the invention. For the sake of clarity, the representation of intensity profiles 5 is dispensed with as in FIG. 1, since the different grey tones G of image points 1 cannot otherwise be seen. Each exposure step comprises a plurality of individual exposures of individual image points 1, in particular carried out in synchrony.

DMD 3, represented here in simplified form by only nine mirrors 4, is moved relative to image points 1, wherein a movement of photosensitive layer 19 in fact takes place and DMD 3 is fixed, preferably mounted vibration-damped as far as possible.

Each time a mirror 4 is switched (controlled) in such a way that it reflects the secondary beam onto photosensitive material 18, this is symbolised by a black dot in the interior of mirror 4. The first image of the series comprises a part of an exposure strip 2, wherein several image points 1 of the lowermost five lines have already been exposed. Each exposed image point 1 has been exposed only once, so that a grey-tone value of 1 can be assigned to each exposed image point 1. According to their strength, the grey-tone values are described by a natural number including zero. As a result of the continuous relative displacement between DMD 3 and photosensitive layer 19 lying beneath, successive mirrors 4 of DMD 3 can expose image points 1, which have already been exposed, once again, insofar as the algorithm provides for the exposure of the respective image point.

If the last image of the series is looked at, it can be seen that the algorithm has been set up such that a dithering pattern results in image point region 8. By way of example, image point 1 in the third image of the series is represented with a grey tone G=1, whilst, as a result of the application of the methods according to the invention, the same image point in the twelfth image of the series has the grey tone G=2, i.e. has received a stronger dose. It has received this through an exposure (not represented) with a subsequent DMD mirror 4 from the same mirror exposure column 10s.

The image series shows on the one hand the use of a dithering algorithm, on the other hand the adjustment of a grey tone G by a multiple exposure of mirror elements switched one after another.

The methods according to the invention for generating an average image point region 8 by the use of a suitable mathematical algorithm would of course also function with black/white (b/w) lithography, i.e. with the use of only two grey tones. However, as a result of the reduced grey-tone depth, the depth resolution of arising image point region 8 would also be much less. Through the combination of a highly resolved grey-tone depth spectrum with the use of the algorithms according to the invention, a very good depth resolution in respect of the exposure can take place.

Figure 3A:
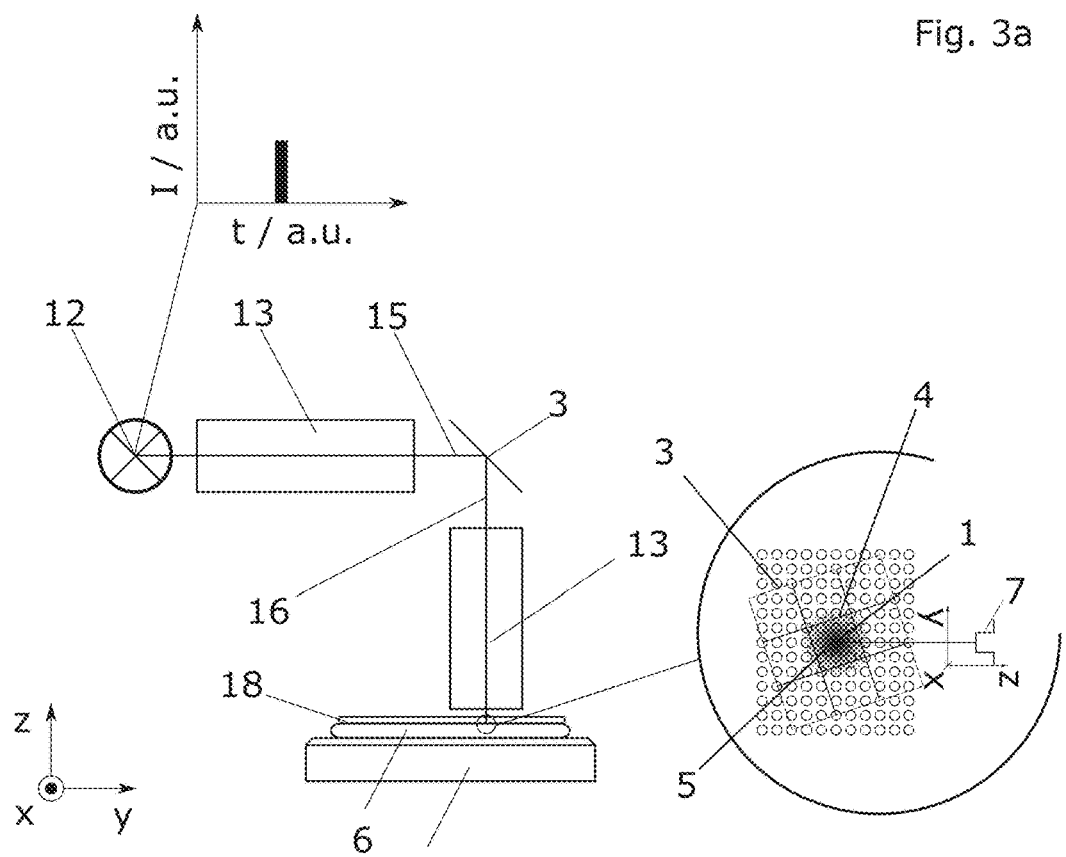
FIG. 3a shows a diagrammatic representation of an embodiment of the device according to the invention in a method step during an exposure by a radiation source with a first intensity spectrum.
Figure 3B:
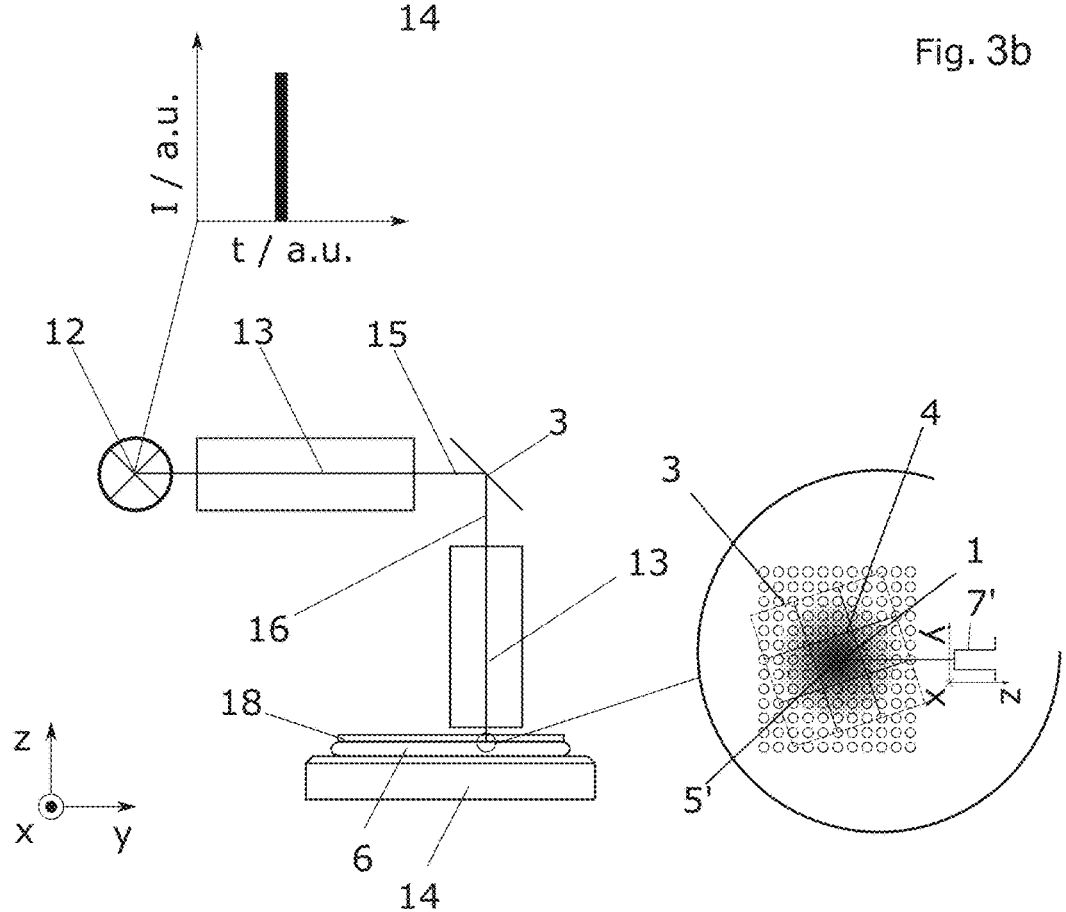
FIG. 3b shows a diagrammatic representation of an embodiment of the device according to the invention in a method step during an exposure by a radiation source with a second intensity spectrum.

FIGS. 3a and 3b show diagrammatic representations of an embodiment of the method according to the invention, wherein the dose, which is used for the exposure of image points 1, is varied by changing the radiation intensity of a radiation source 12. In order to keep the representation simple, a state is shown in which once again only one mirror 4 of a DMD 3 is switched in such a way that it exposes an image point 1 on a photosensitive material 18.

Radiation source 12 generates a primary beam 15, which can be influenced by optical elements 13 before it strikes DMD 3. Individual mirrors 4 of DMD 3 generate there a corresponding number of individual secondary beams 16 for the generation of individual image points 1. Through the intensity of radiation source 12, the strength of the dose, the shape of intensity profiles 5, 5' and therefore grey-tone G is influenced and defined. The definition can be determined empirically or by physical-chemical processes. The optical system is the sum of optical elements 13 and DMD 3.

Figure 4:
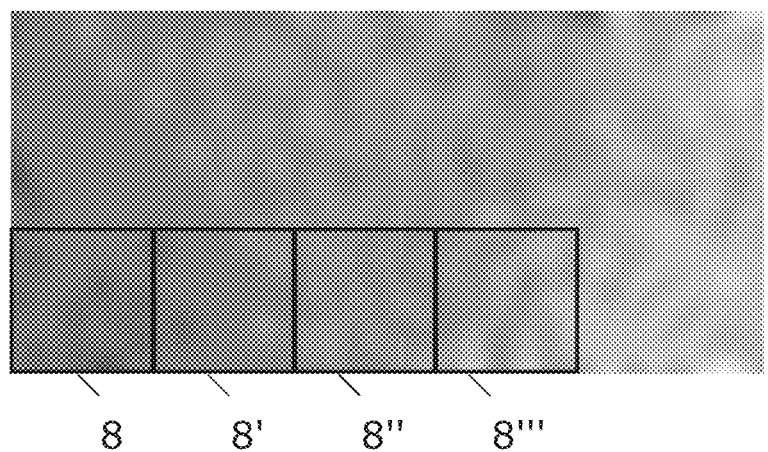
FIG. 4 shows a diagrammatic representation of a photosensitive layer exposed with an embodiment of the invention.

FIG. 4 shows a grey-tone gradient generated by the method according to the invention produced from average grey tones, the strength of which gradient diminishes from left to right. A detail comprising 5 lines and 4 columns of image point regions 8, 8', 8", 8'" is represented. Each image point region 8, 8', 8", 8'" comprises nine image points (not shown), a total of 15×12, i.e. 180 image points, is then present.

Image point region 8 has the strongest average grey tone (out of the nine grey tones G of the individual image points not represented). The average grey tones of image point regions 8', 8", 8'" diminish continuously from left to right. Each average grey tone of an image point region 8, 8', 8", 8'" has being produced by the use of mathematical algorithms in combination with the grey-tone adjustment of individual image points 1 (not shown for the sake of clarity) according to the methods according to the invention described above.

Figure 5:
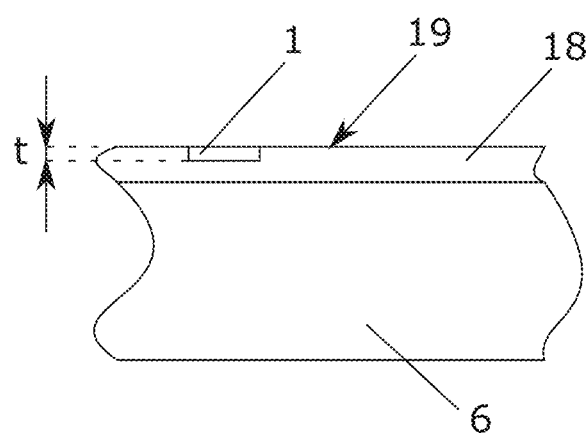
FIG. 5 shows a diagrammatic cross-sectional representation of a detail of the substrate with the photosensitive layer to be exposed.

FIG. 5 shows a part of a cross-section of a substrate 6, on which a photosensitive layer 19, comprising a photosensitive material 18, has been deposited. An image point 1, with an exposure profile depth t, is also represented. It can be seen that exposure profile depth t makes up roughly one third of the total thickness of photosensitive layer 19.

LIST OF REFERENCE NUMBERS

1 image point
2 exposure strips
3 micro-mirror device (DMD)
4, 4', 4" mirrors
4c mirror centre
5, 5' intensity profile
6 substrate
8, 8', 8", 8'" image point region
9z mirror line
9s mirror column
10z, 10z', 10z" mirror exposure line
10s mirror exposure column
11z image point line
11s image point column
12 radiation source
13 optical elements
14 substrate holder
15 primary beam
16 secondary beam(s)
17 mirror exposure line block
18 photosensitive material
19 photosensitive layer
G grey tone
D individual dose
α angle
v movement direction (speed)
t exposure profile depth
n spacing of image point lines
m spacing of image point columns

What is claimed is:

1. A method for the exposure of image points of a layer comprising a photosensitive material on a substrate by means of an optical system, said method comprising:
    continuously moving the image points with respect to the optical system; and
    controlling a plurality of secondary beams by use of the optical system individually for individual exposures of each image point, whereby the secondary beams are put either into an ON state or into an OFF state, wherein:
        a) secondary beams in the ON state produce an individual exposure of the image point assigned to the respective secondary beam; and
        b) secondary beams in the OFF state do not produce any individual exposure of the image point assigned to the respective secondary beam,
    wherein, for the generation of image points with grey tones n>1; individual exposures are carried out by different secondary beams with individual doses D,
    wherein the grey tone G of each image point is defined by the sum of individual doses D,
    wherein the grey tones G are further defined by n individual exposures with different individual doses D due to a change in a radiation intensity of the secondary beams such that a relationship between the radiation intensity of the secondary beams and the sum of the individual doses D is nonlinear,
    wherein the grey tone G of at least one of the image points is generated by:
        superposition of the image points in a lateral direction based on intensity profiles of the secondary beams; and
        means of successively arranged mirrors of a digital micromirror device, and
    wherein a width of the intensity profiles is greater than or equal to a width of the successively arranged mirrors.

2. The method according to claim 1, further comprising:
    grouping together grey tones of a plurality of adjacent image points to form an image point region to produce the definition of an averaged grey-tone value of the image point region.

3. The method according to claim 1, further comprising:
    generating the secondary beams from a primary beam generated from a radiation source by use of the optical system.

4. The method according to claim 1, further comprising:
    controlling the secondary beams in synchrony by use of the optical system.

5. The method according to claim 1, wherein the optical system is a maskless optical system.

6. The method according to claim 1, wherein the grey tones of a plurality of adjacent image points are grouped together to form an image point region by use of a dithering algorithm.

7. The method according to claim 1, wherein the optical system is a micro mirror device.

8. The method according to claim 1, wherein the secondary beams are controlled exclusively in synchrony by use of the optical system.

9. The method according to claim 1, wherein the mirrors of the digital micromirror device comprise the successively arranged mirrors, and
    wherein the mirrors of the digital micromirror device are switched simultaneously.

10. The method according to claim 1, wherein the intensity profiles of the secondary beams overlap with respect to each image point to define the grey tone G of each image point.

11. A device for the exposure of image points of a photosensitive layer including a photosensitive material on a substrate by means of an optical system, said device comprising:
    means for the continuous movement of the image points with respect to the optical system;
    control means for the individual control of a plurality of secondary beams by means of the optical system for individual exposures of each image point, whereby the secondary beams can be put either into an ON state or into an OFF state; and individual exposure means for carrying out individual exposures by different secondary beams with individual doses D for the generation of image points with grey tones n>1, wherein:
- a) secondary beams in the ON state produce an individual exposure of the image point assigned to the respective secondary beam; and
- b) secondary beams in the OFF state do not produce any individual exposure of the image point assigned to the respective secondary beam, wherein the grey tone G of each image point is defined by the sum of the individual doses D, wherein the grey tones G are further defined by n individual exposures with different individual doses D due to a change in a radiation intensity of the secondary beams such that a relationship between the radiation intensity of the secondary beams and the sum of the individual doses D is nonlinear, wherein the grey tone G of at least one of the image points is generated by:
- superposition of the image points in a lateral direction based on intensity profiles of the secondary beams; and
- means of successively arranged mirrors of a digital micromirror device, wherein a width of the intensity profiles is greater than or equal to a width of the successively arranged mirrors.

12. The device according to claim 11, wherein the optical system generates the secondary beams from a primary beam generated from a radiation source.

13. The device according to claim 12, wherein the optical system for generating the secondary beam from the primary beam generated from a radiation source is a micro mirror device.

14. The device according to claim 11, wherein the secondary beams are controlled in synchrony by means of the optical system.

15. The device according to claim 14, wherein the secondary beams are controlled exclusively in synchrony by means of the optical system.

16. The device according to claim 11, wherein the optical system is a maskless optical system.

17. The device according to claim 11, wherein the mirrors of the digital micromirror device comprise the successively arranged mirrors, and
wherein the mirrors of the digital micromirror device are switched simultaneously.

18. The device according to claim 11, wherein the intensity profiles of the secondary beams overlap with respect to each image point to define the grey tone G of each image point.

* * * * *